(12) United States Patent
Maier (10) Patent No.: US 9,490,173 B2
(45) Date of Patent: Nov. 8, 2016

(54) METHOD FOR PROCESSING WAFER

(71) Applicant: Infineon Technologies AG, Neubiberg (DE)

(72) Inventor: Hubert Maier, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/066,777

(22) Filed: Oct. 30, 2013

(65) Prior Publication Data

US 2015/0115448 A1    Apr. 30, 2015

(51) Int. Cl.
| | |
|---|---|
| H01L 21/00 | (2006.01) |
| H01L 21/82 | (2006.01) |
| H01L 21/306 | (2006.01) |
| H01L 21/768 | (2006.01) |
| H01L 23/31 | (2006.01) |
| H01L 21/78 | (2006.01) |
| H01L 21/56 | (2006.01) |

(52) U.S. Cl.
CPC ............. *H01L 21/82* (2013.01); *H01L 21/306* (2013.01); *H01L 21/7685* (2013.01); *H01L 21/78* (2013.01); *H01L 23/3114* (2013.01); *H01L 23/3157* (2013.01); *H01L 23/3185* (2013.01); *H01L 21/561* (2013.01); *H01L 2924/0002* (2013.01)

(58) Field of Classification Search
CPC ....... H01L 23/48; H01L 21/50; H01L 21/82; H01L 21/00

USPC .................. 438/107–127, 64, 15, 25–26, 55; 257/751, 100, E33.056–E33.059, 257/E33.06, E23.001, E21.499, 486, 257/787–790, E52.02, E31.117, E23.116, 257/E23.126–E23.129, E21.502–E21.503
See application file for complete search history.

(56) References Cited

U.S. PATENT DOCUMENTS

| | | | | |
|---|---|---|---|---|
| 5,691,248 | A * | 11/1997 | Cronin et al. | ................. 438/109 |
| 6,566,745 | B1 * | 5/2003 | Beyne | ............... H01L 27/14618 257/431 |
| 2005/0194605 | A1 * | 9/2005 | Shelton et al. | .................. 257/99 |
| 2006/0281296 | A1 * | 12/2006 | Misra et al. | .................. 438/618 |
| 2009/0011543 | A1 | 1/2009 | Karta et al. | |
| 2010/0029045 | A1 * | 2/2010 | Ramanathan | ......... H01L 21/565 438/114 |
| 2010/0120230 | A1 * | 5/2010 | Grivna et al. | ................ 438/464 |
| 2010/0164082 | A1 * | 7/2010 | Fujisawa | ............... H01L 21/561 257/680 |
| 2010/0261335 | A1 * | 10/2010 | Andry et al. | .................. 438/462 |
| 2011/0156280 | A1 * | 6/2011 | Takamoto | ........... H01L 21/6836 257/778 |
| 2011/0215342 | A1 * | 9/2011 | Oliver | ..................... B29C 43/18 257/81 |

(Continued)

*Primary Examiner* — Yuanda Zhang
*Assistant Examiner* — Sheikh Maruf (57) ABSTRACT

A method for processing a wafer including a plurality of chips is provided. The method may include: forming a trench in the wafer between the plurality of chips; forming a diffusion barrier layer at least over the sidewalls of the trench; forming encapsulation material over the plurality of chips and in the trench; and singularizing the plurality of chips from a side opposite the encapsulation material.

17 Claims, 9 Drawing Sheets

(56) References Cited

U.S. PATENT DOCUMENTS

| | | | |
|---|---|---|---|
| 2012/0168944 A1* | 7/2012 | Gan et al. | 257/738 |
| 2012/0193779 A1* | 8/2012 | Lee et al. | 257/737 |
| 2012/0256306 A1* | 10/2012 | Yu | H01L 23/3107 257/676 |
| 2012/0315726 A1* | 12/2012 | Byun et al. | 438/109 |
| 2013/0026632 A1* | 1/2013 | Kikuchi | H01L 21/6835 257/753 |
| 2013/0037917 A1* | 2/2013 | Xue | H01L 23/3114 257/621 |
| 2013/0193575 A1* | 8/2013 | Shen | 257/751 |
| 2013/0234160 A1* | 9/2013 | Matsuno | H01L 21/78 257/77 |
| 2013/0249095 A1* | 9/2013 | Shen | 257/751 |
| 2013/0280826 A1* | 10/2013 | Scanlan | H01L 23/544 438/15 |
| 2014/0077345 A1* | 3/2014 | Uno | H01L 23/3135 257/664 |
| 2015/0091187 A1* | 4/2015 | Reber | H01L 23/481 257/774 |
| 2015/0221523 A1* | 8/2015 | Zundel | H01L 23/49838 257/734 |

* cited by examiner

METHOD FOR PROCESSING WAFER

TECHNICAL FIELD

Various embodiments relate generally to a method for processing a wafer including a plurality of chips.

BACKGROUND

In conventional processes for separating a wafer including a plurality of chips into a plurality of individualized chips, which may be formed such that a backside-metallization for a subsequent diffusion soldering may be provided, a forming of a binary compound of copper and silicon may occur, wherein such compound may be copper silicide (e.g. pentacopper silicide, $Cu_5Si$). This intermetallic binary compound $Cu_5Si$ may be formed upon heating mixtures of copper and silicon, e.g. due to diffusion soldering, wherein in a conventional processed chip copper is typically included within the back side metallization and silicon is typically included within the chip material. In conventional chip processing copper silicide thin film may be used for passivation of copper-based chips, where it may serve to suppress diffusion and electromigration and may serve as a diffusion barrier. The copper silicide is usually formed either at regions of a processed back side metallization of the chips of the plurality of chips and/or at the chip edges of these chips, i.e. at the interface of the back side metallization and the chip edges, for instance. The forming of the copper silicide at these regions may lead to an increasing volume of the chip material at such regions which in turn may lead to material split-offs (e.g. so-called chip cracks).

SUMMARY

A method for processing a wafer including a plurality of chips is provided. The method may include: forming a trench in the wafer between the plurality of chips; forming a diffusion bather layer at least over the sidewalls of the trench; forming encapsulation material over the plurality of chips and in the trench; and singularizing the plurality of chips from a side opposite the encapsulation material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The prevention of copper silicide ($Cu_5Si$) formation at regions at the back side metallization of a plurality of chips and/or their chip edges (e.g. at the interface of the back side metallization and the chip edges) during one or more processes for separating a wafer including a plurality of chips into a plurality of individualized chips, wherein the back side metallization may be formed for a subsequent diffusion soldering, may be obtained by means of forming at least one diffusion barrier layer. The at least one diffusion barrier layer (e.g. a metal diffusion barrier layer) may be formed such that an increase of the chip material volume at the regions of the back side metallization of the chip, the chip edges, and/or their interface may be avoided. Preventing an increase of the volume at these regions may in turn avoid cracking or splitting of the chip material. Various methods for processing a wafer including a plurality of chips may prevent a formation of copper silicide at these regions of the plurality of chips and thus, the cracking or splitting of chip material. Therefore, various methods may avoid rejections or further required postprocessing to remove defects from the individualized chips. Therefore, various methods may decrease manufacturing costs by way of reducing rejections.

Figure 1:
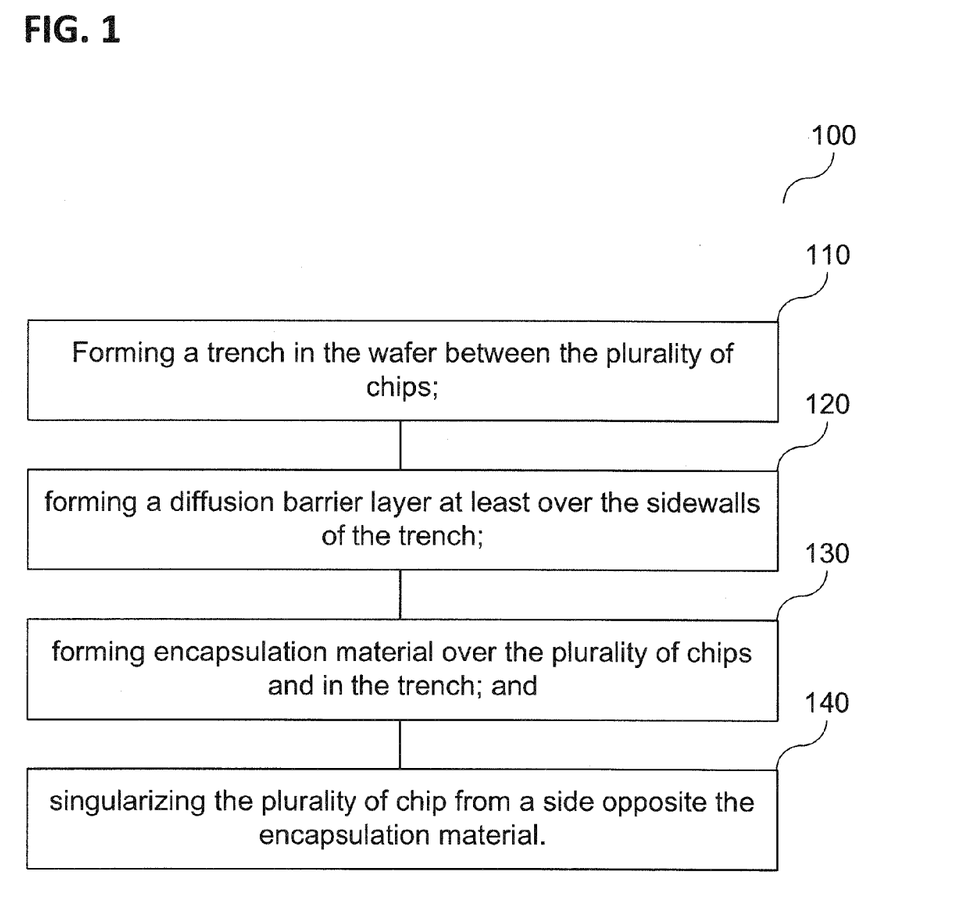
FIG. 1 shows a method for processing a wafer according to various embodiments.

FIG. 1 shows a method 100 for processing a wafer according to various embodiments. The method 100 for processing a wafer including a plurality of chips may be provided. The method 100 may include: forming a trench in the wafer between the plurality of chips (in 110); forming a diffusion barrier layer at least over the sidewalls of the trench (in 120); forming encapsulation material over the plurality of chips and in the trench (in 130); and singularizing the plurality of chips from a side opposite the encapsulation material (in 140).

By way of example, the at least one wafer may be a wafer, a part of a wafer, a substrate, a part of a substrate, a carrier, a part of a carrier, and the like. The at least one wafer may further include at least one of a processed wafer, a processed substrate, a processed carrier, and the like.

The at least one wafer may be formed from at least one of the group of semiconductor materials, wherein the group of semiconductor materials may include or consist of: Silicon (Si), Silicon carbide (SiC), Silicon germanium (SiGe), Germanium (Ge), α-Tin (α-Sn), Boron (B), Selenium (Se), Tellurium (Te), Sulfur (S), Gallium phosphide (GaP), Gallium arsenide (GaAs), Indium phosphide (InP), Indium antimonide (InSb), Indium arsenide (InAs), Gallium antimonide (GaSb), Gallium nitride (GaN), Aluminum nitride (AlN), Indium nitride (InN), Aluminum gallium arsenide ($Al_xGa_{1-x}As$), and/or Indium gallium nitride ($In_xGa_{1-x}N$). Moreover, the one or more materials of the one or more semiconductor substrates may be one or more compound semiconductors from the group of compound semiconductors of the following groups of the periodic system: II-V, II-V, II-VI, I-VII, IV-VI and/or V-VI.

The at least one wafer may have a first side and a second side opposite the first side, wherein the first side may be a processed side which may be processed in at least one previous Front-End-of-Line (FEOL) process (the first side may also be referred to as main processing side or front side) and the second side may be a side which may be subsequently processed subsequently by means of at least one process such as thinning (e.g. by means of grinding the wafer), forming a back side metallization, diffusion soldering, and the like (the second side may also be referred to as rear side).

The at least one wafer may have a footprint of at least one of the group of geometric shapes, wherein the group may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

In case of a circular shaped wafer, the at least one wafer may have a diameter in the range from about 1 mm to about 1000 mm, e.g. in the range from about 25 mm to about 450 mm, e.g. in the range from about 1 mm to about 500 mm.

The at least one wafer may have a thickness, wherein the thickness may be a distance extending between first and second sides of the at least one wafer. The thickness of the at least one wafer may be in the range from about 1 μm to about 10 mm, e.g. in the range from about 250 μm to about 1 mm, e.g. in the range from about 200 μm to about 950 μm.

The at least one wafer may include a plurality of chips, wherein the individual chips of the plurality of chips may be formed by separating chips from the plurality of chips from the wafer. The at least one wafer may include or support the plurality chips on the first side, wherein the chips of the plurality of chips may be formed in the wafer or the plurality of chips may be mounted (e.g. bonded) on at least one side (e.g. first side) of the wafer.

The chips of the plurality of chips may be also referred to as dies. The dies (or chips) may be formed having a first side and a second side opposite the first side. The first side of the at least one chip may be a side where one or more electronic structures and/or structured elements may be formed previously by means of one or more processes, e.g. by one or more FEOL processes, such as layer deposition, patterning, doping, and/or heat treatment.

The at least one electronic structure and/or structured element may be formed from at least one of the group of electronic structures or structured elements, wherein the group may include or consist of: a diode, a transistor, a bipolar junction transistor, a field effect transistor, a resistor, a capacitor, an inductor, a thyristor, a power transistor, a power metal oxide semiconductor (MOS) transistor, a power bipolar transistor, a power field effect transistor, a power insulated gate bipolar transistor (IGBT), a MOS controlled thyristors, a silicon controlled rectifier, a power schottky diode, a silicon carbide diode, a gallium nitride device, an ASIC, a driver, a controller, and/or a sensor.

Each chip of the plurality of chips may have a footprint, wherein the shape of the footprint may be at least one of the group of geomtric shapes, wherein the group may include or consist of: a circle, a square, a rectangle, a rhombus, a trapezoidal, a parallelogram, a triangle, an ellipse, a pentagon, a hexagon, a heptagon, an octagon, a nonagon, a polygon, and the like. Moreover, one or more chips of the plurality of chips may have a different footprint. In other words, at least two chips of the plurality may be formed having a different shaped footprint to each other.

Each chip of the plurality of chips may have a thickness, wherein the thickness may be a distance extending between first and second sides of the chip. The thickness of the initially formed chip may be different to a predetermined thickness which may be formed by at least one subsequent thinning process. The thickness of each chip may be in the range from about 1 μm to about 10 mm, e.g. in the range from about 250 μm to about 1 mm, e.g. in the range from about 200 μm to about 950 μm.

The footprint of each chip of the plurality of chips may have an area which may be in the range from about 0.01 $mm^2$ to about 600 $mm^2$, e.g. in the range from about 1 $mm^2$ to about 100 $mm^2$, e.g. in the range from about 25 $mm^2$ to about 250 $mm^2$. Moreover, the footprint of at least two chips of the plurality of chips may be different, i.e. a different shape and/or area, to each other. In other words, at least one chip may have a different footprint compared to another chips of the plurality of chips.

In 110, at least one trench may be formed at least partially into the wafer by means of at least one from the group of separation methods (or dicing methods), wherein the group may include or consist of: mechanical sawing, laser dicing, and/or plasma dicing, etching, plasma etching, and the like.

The at least one trench may be formed at least partially into the wafer such that the at least one trench may have a predetermined depth. The at least one trench may extend from the first side of the wafer up to a predetermined depth into the wafer. The predetermined depth of the at least one trench may be in the range from 1 μm to about 10 mm, e.g. in the range from about 10 μm to about 200 μm, e.g. in the range from about 50 μm to about 500 μm.

In case of a plurality of trenches, these trenches may be formed such that at least two trenches of the plurality of trenches may be formed with different predetermined depths.

The at least one trench may be formed at least partially into the wafer extending from the first side up to a predetermined depth into the wafer, wherein the predetermined depth may be selected such that the at least one trench may be deeper than the desired thickness of the processed chips of the plurality of chips may have after the processing. The at least one trench may be formed such that each chip of the plurality of chips may be supported onto the wafer.

The at least one trench may be formed such that at least its cross-sectional area may be one of the group of geometric shapes, wherein the group may include or consist of: a semi-circle, a semi-ellipse, a triangle, a square, a trapezoid, a parallelogram, a polygon, and the like.

In 120, at least one diffusion barrier layer may be formed at least partially over the sidewalls of the at least one trench and/or the first side of the plurality of chips, e.g. the diffusion barrier layer may be formed such that the diffusion barrier layer may cover the first side of the plurality of chips and the sidewalls of the at least one trench.

The at least one diffusion barrier layer may include at least one metal diffusion barrier layer, wherein this layer may prevent the diffusion of a metal, such as copper. By way of example, preventing the diffusion of a metal, e.g. copper, may prevent the forming of copper silicide (Cu$_5$Si) at the regions which may be covered by the at least one diffusion barrier layer.

The at least one diffusion barrier layer may be formed from at least one of the group of diffusion barrier layer materials, wherein the group may include or consist of: titanium, titanium nitride (TiN), titanium tungsten (TiW), titanium dioxide (TiO$_2$), titanium compounds including e.g.: aluminum (Al), vanadium (V), manganese (Mn), molybdenum (Mo), palladium (Pd), copper (Cu), zirconium (Zr), tin (Sn), and the like.

The at least one diffusion barrier layer may have a layer thickness. The layer thickness may be a distance which may extend between first and second sides of the at least one diffusion barrier layer. The layer thickness may be in the range from about 50 nm to about 200 nm, e.g. in the range from about 75 nm to about 150 nm, e.g. of about 100 nm.

The at least one diffusion barrier layer may be formed from at least one of the group of deposition methods, wherein the group may include or consist of: a physical vapor deposition such as cathodic arc deposition, electron beam physical vapor deposition (EBPVD), evaporative deposition (e.g. molecular beam epitaxy (MBE)), flash evaporation, resistive evaporation), pulsed laser deposition, and sputter deposition such as ion-beam sputtering, reactive sputtering, ion-assisted deposition, high-target-utilization sputtering, high-power impulse magnetron sputtering (HIPIMS), gas flow sputtering, and the like.

Optionally, more than one diffusion bather layers (e.g. a plurality of diffusion bather layers) may be formed layer by layer at least partially over the plurality of chips and the sidewalls of the at least one trench and/or the first side of the plurality of chips, e.g. a stack of various diffusion barrier layers may be formed such that this stack may cover the first side of the plurality of chips and the sidewalls of the at least one trench. The various diffusion bather layers within the stack may have different thicknesses.

Optionally, the method 100 may further include forming at least one passivation layer which may be formed either before or after forming the at least one diffusion bather layer at least partially over the plurality of chips and the sidewalls of the at least one trench. Furthermore, the at least one passivation layer may be formed as an adherent passivation layer. In other words, the passivation layer may be formed having at least one adhesive surface, e.g. for improving adhesive properties between substrate and diffusion bather layer or between diffusion bather layer and encapsulation material.

In various embodiments, in case of two passivation layers and one diffusion bather layer, the passivation layers may be formed before and after the diffusion barrier layer. Furthermore, by way of example, in case of a plurality of passivation layers and a plurality of diffusion barrier layers, a stack of alternating layers (e.g. passivation layer—diffusion barrier layer—passivation layer— . . . , or e.g. diffusion barrier layer—passivation layer—diffusion layer— . . . ) may be formed at least partially over the plurality of chips and/or the sidewalls of the at least one trench.

In various embodiments, the at least one passivation layer may be formed at least partially over the plurality of chips and/or the sidewalls of the at least one trench before the at least one diffusion barrier layer may be formed. In other words, the first layer formed at least partially over the plurality of chips and/or the sidewalls of the at least one trench may be at least one passivation layer and the at least one diffusion barrier layer may be formed subsequently over the at least one passivation layer.

In various embodiments, the at least one diffusion layer may be formed at least partially over the plurality of chips and/or the sidewalls of the at least one trench before the passivation layer may be formed. In other words, the first layer formed at least partially over the plurality of chips and/or the sidewalls of the at least one trench may be the diffusion barrier layer and the at least one passivation layer may be formed subsequently over the at least one diffusion barrier layer.

In various embodiments, the at least one passivation layer may be formed before forming the at least one diffusion barrier layer, the second side of the at least one passivation layer may be formed adjacent to the first side of the plurality of chips and/or the sidewalls of the trench. Furthermore, the first side of the at least one passivation layer may be formed adjacent to the second side of the at least one diffusion barrier layer.

In various embodiments, the at least one passivation layer may be formed after forming the at least one diffusion barrier layer, wherein the at least one passivation layer may be formed adjacent to (e.g. in physical contact with) the at least one diffusion barrier layer.

The passivation layer may be formed by means of at least one of the group of passivation materials, wherein the group may include or consist of: silicon dioxide (SiO$_2$), silicon nitride (SiN), titanium dioxide (TiO$_2$), aluminum oxide (Al$_2$O$_3$), any combination of these materials, and the like.

The passivation layer may be formed by means of at least one of the group of deposition methods, wherein the group may include or consist of: any physical vapor deposition such as cathodic arc deposition, electron beam physical vapor deposition (EBPVD), evaporative deposition (e.g. MBE), flash evaporation, resistive evaporation), pulsed laser deposition, and sputter deposition such as ion-beam sputtering, reactive sputtering, ion-assisted deposition, high-target-utilization sputtering, high-power impulse magnetron sputtering (HIPIMS), gas flow sputtering, and the like.

In various embodiments, one or more layers may be formed over the plurality of chips and/or the sidewalls of the trench, wherein at least one diffusion barrier layer may be formed. Moreover, also further suitable layers (e.g. one or more buffer layers) may be formed either before or after forming at least the diffusion barrier layer and/or the at least one passivation layer at least partially over the plurality of chips and/or the sidewalls of the at least one trench. Such further layers may be formed alternatingly with the at least one diffusion barrier layer and/or the at least one passivation layer.

The at least one passivation layer may have a layer thickness. The layer thickness may be a distance which may extend between first and second sides of the at least one passivation layer. The layer thickness may be in the range from about 50 nm to about 2 μm, e.g. in the range from about 50 nm to about 500 nm, e.g. in the range from about 100 nm to about 1 μm In 130, at least one encapsulation material may be formed at least partially over the plurality of chips and in the at least one trench. The at least one encapsulation material may be formed as a layer adjacent to e.g. the at least one diffusion bather layer or the at least one passivation layer.

The at least one encapsulation material may have a thickness. The thickness may be a distance which may extend between first and second sides of the at least one encapsulation material. The layer thickness may be in the range from about 100 nm to about 1 mm, e.g. in the range from about 500 nm to about 100 µm, e.g. in the range from about 0.1 µm to about 10 µm.

The at least one encapsulation material may be formed such that the trench and the plurality of chips may be covered at least partially by the at least one encapsulation material. By way of example, the at least one encapsulation material may be formed such that the trench may be filled at least partially by the at least one encapsulation material, as well as, the plurality of chips may be coverd at least partially by the at least one encapsulation material.

The at least one encapsulation material may be formed at least partially over the at least one diffusion bather layer and/or the at least one passivation layer which may be formed on the plurality of chips and in the trench by means of at least one of the group of deposition methods, wherein the group may include or consist of: spray coating, spin coating, spin-on, spin casting, and the like.

The encapsulation material may be formed from at least one of the group of encapsulation materials, wherein the group may include or consist of: polyester resin, vinyl ester resin, synthetic resin, fiberglass, epoxy, polymers, polyimide (PI), polyamide (PA), Polyamide-imide (PAI), poly(methyl glutarimide) (PMGI), SU-8, Phenol formaldehyde resins (PF), Poly(methyl methacrylate) (PMMA), any combination of these encapsulation materials, and the like.

In various embodiments, more than one layer (e.g. a plurality of layers) from one or more encapsulation materials may be formed at least partially over the at least one diffusion bather layer and/or the at least one passivation layer which may be formed over the plurality of chips and in the trench. By way of example, the layer of the encapsulation material may be formed from different encapsulation materials and layers thereof, e.g. a stack of various encapsulation materials and layers thereof.

The method 100 may further include removing the at least one encapsulation material at least from a portion of the at least one trench, so that this portion may be either substantially free from at least the at least one encapsulation material or may be at least partially free from the at least one encapsulation material. Therefore, the at least one encapsulation material may be used as a resist in order to provide a lithographic mask for at least one subsequent process step for exposing the at least one trench. The at least one trench may be exposed by means of a lithographic processing (e.g. IMID lithography), wherein at this step the at least one trench may be exposed by means of etching and/or plasma etching. The etching (or plasma etching) may be performed by means of an anisotropic etching (or anisotropic plasma etching).

The anisotropic etching (or anisotropic plasma etching) may be performed in order to etch the different materials (at least one of e.g. the encapsulation layer, buffer layers, passivation layer, and/or diffusion barrier layer) differently. In other words, the anisotropic etching (or anisotropic plasma etching) may erode (or remove) the different materials (at least one of e.g. the encapsulation layer, buffer layer, passivation layer, and/or diffusion barrier layer) at different rates so that this process step may be configured to adjust the removal (or etching, erosion) of the above mentioned materials as desired. In addition, by means of anisotropic etching (or anisotropic plasma etching) desired portions may be exposed from at least one of the encapsulation layer, buffer layer, passivation layer, and/or diffusion barrier layer.

Subsequent to the FEOL processing, the at least one wafer including the plurality of chips, the at least one diffusion barrier layer (and optionally, the at least one passivation layer and/or the at least one buffer layer), and the at least one encapsulation material may be mounted (e.g. bonded) on at least one specific foil which may be mounted on at least one carrier (e.g. a glas carrier). The at least one wafer including the plurality of chips, the least one diffusion barrier layer (and optionally, the at least one passivation layer and/or the at least one buffer layer), and the at least one encapsulation material may be mounted (e.g. bonded) with the first side which may be the side where the plurality of chips, at least the diffusion barrier layer (and optionally, the at least one passivation layer and/or the at least one buffer layer), and the at least one encapsulation material may be formed over the at least one foil which may be mounted on the at least one carrier (e.g. a glass carrier).

The at least one carrier may be formed from at least one of the group of carrier materials, wherein the group may include or consist of: glass, copper (Cu), aluminum (Al), ceramic, any semiconductor substrate as described above, any combination, compound or alloys of these carrier materials, and the like.

The at least one carrier may have a first side and a second side opposite the first side, wherein the first side may be adjacent to the at least one foil and the second side may be a bare side.

The at least one carrier may have a thickness, wherein the thickness may be a distance extending between first and second sides of the at least one carrier. The thickness of the at least one carrier may be in the range from about 1 µm to about 10 cm, e.g. in the range from about 1 mm to about 2 cm, e.g. in the range from about 5 mm to about 5 cm.

The at least one carrier may be formed from a plurality of various carriers which may be formed from various carrier materials and may be formed as a stack of various carriers including various thicknesses.

The at least one foil may have a first side and a second side opposite the first side, wherein the first side may be adjacent to the wafer including the plurality of chips, the at least one diffusion barrier layer (optionally, the at least one passivation layer), and the at least one encapsulation material and the second side may be adjacent to the first side of at least one the carrier.

The at least one foil may have a thickness, wherein the thickness may be a distance extending between first and second sides of the at least one foil. The thickness of the carrier may be in the range from about 0.1 µm to about 10 mm, e.g. in the range from about 1 µm to about 0.1 mm, e.g. in the range from about 1 µm to about 0.5 mm.

The at least one foil may be formed from a plurality of foils which may be formed from various foil materials and may be formed as a stack of various foils including various thicknesses.

The at least one foil may be formed to provide an adhesive device for mounting the at least one processed wafer including the plurality of chips, the least one diffusion barrier layer (optionally, the at least one passivation layer and/or the at least one buffer layer), and the at least one encapsulation material onto the at least one carrier (e.g. glass carrier). The at least one foil may be formed from at least one of the group of foil materials, wherein the group may include or consist of: polyester resin, vinyl ester resin, synthetic resin, fiberglass, epoxy, polymers, polyimide (PI), polyamide (PA), Polyamide-imide (PAI), polyvinyl chloride (PVC), polyethylene (PE), any combination of these foil materials, and the like. In addition, the at least one foil may be coated by a further adhesive (e.g. glue) material. Moreover, the at least one foil may be damping device for suppression of tensile and impact forces that may occur during further processing.

In 140, the at least one mounted wafer including the plurality of chips, the least one diffusion barrier layer (and optionally, the at least one passivation layer), and the at least one encapsulation material may be thinned from the back side (or second side of the at least one wafer), wherein thinning the wafer may include a grinding of the at least wafer. The grinding of the at least one may separate the plurality of chips by means of grinding to a desired thickness of the chips of the plurality of chips, wherein such thickness may be selected so that the at least one trench may be formed deeper into the wafer as the desired thickness of the chips of the plurality of chips. In other words, in case that the depth of the at least one trench may is formed deeper into the at least one wafer than the desired thickness of the chips of the plurality of chips may be thinned, the plurality of chips may be separated into individual chips.

The method 100 may further include forming at least one metallization structure over the side opposite the at least one encapsulation material, wherein the at least one metallization structure may be formed to provide at least a back side metallization on the chips of the plurality of chips, wherein the back side metallization may be formed for a subsequent diffusion soldering. The at least one metallization structure may be formed from at least one of the group of metals, wherein the group may include or consist of: copper (Cu), iron (Fe), gold (Au), silver (Ag), titanium (Ti), aluminum (Al), any compound of these metals, copper alloys, iron alloys, gold alloys, silver alloys, titanium alloys, aluminum alloys, and the like.

The at least one metallization structure may be formed by means of at least one of the group of deposition methods, wherein the group may include or consist of: any physical vapor deposition such as cathodic arc deposition, electron beam physical vapor deposition (EBPVD), evaporative deposition (e.g. MBE), flash evaporation, resistive evaporation), pulsed laser deposition, and sputter deposition such as ion-beam sputtering, reactive sputtering, ion-assisted deposition, high-target-utilization sputtering, high-power impulse magnetron sputtering (HIPIMS), gas flow sputtering, and the like.

Then, the plurality of chips may be removed (e.g. demounted or unlaminated) from the at least one foil and the at least one carrier so that at least one chip of the plurality of chips may be processed further.

In various embodiments, the plurality of chips may be removed (e.g. demounted or unlaminated) by means of a conventional pick-and-place process.

Figure 2:
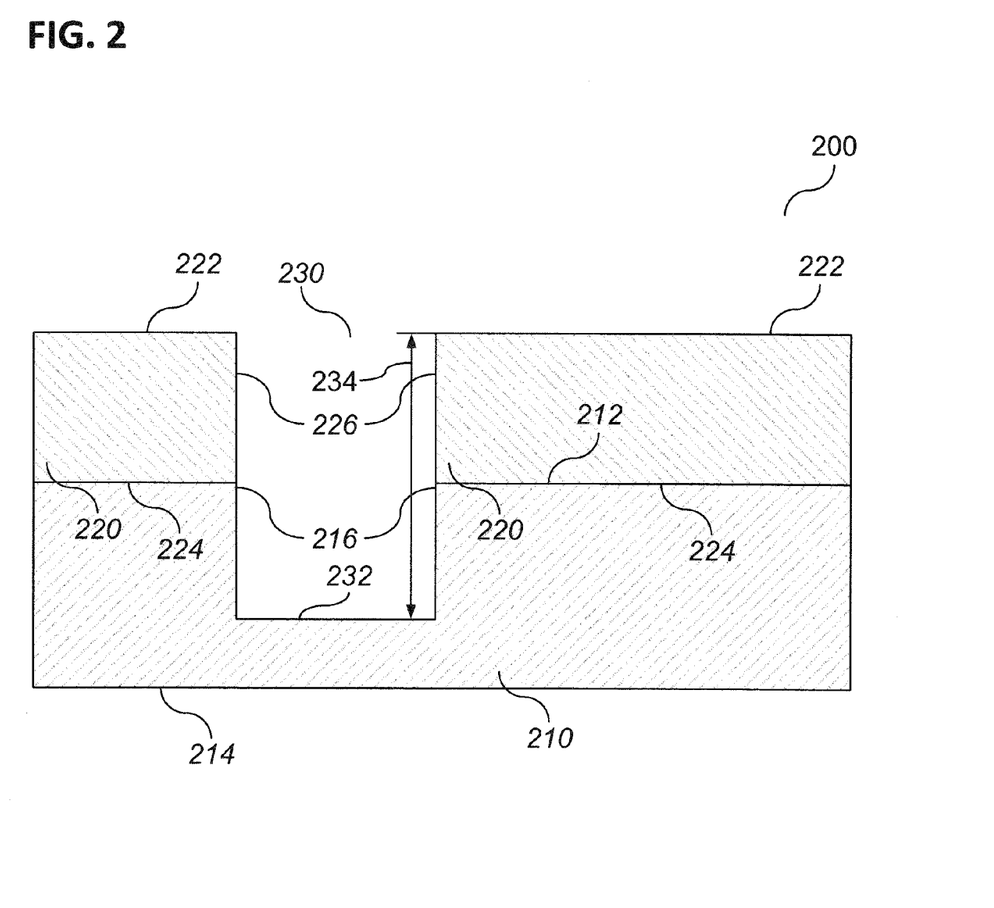
FIG. 2 shows a chip arrangement according to various embodiments.

FIG. 2 shows a chip arrangement 200. The chip arrangement 200 may include a wafer 210 including a plurality of chips 220. The wafer 210 and the plurality of the chips 220 may be similar to the wafer and the plurality of chips described above. The wafer may have a first side 212 and a second side 214 opposite the first side 212, wherein the second side 214 may be substantially a bare side. The wafer 210 may include a plurality of chips 220 formed over the first side 212. The plurality of chips 220 may have a first side 222 and a second side 224 opposite the first side 222, wherein the second side 224 may be formed adjacent to the first side 212 of the wafer 210 and the first side 222 may be substantially a side where at least one electronic structure and/or structured element may be formed previously, wherein the at least one electronic structure and/or structured element may be similar to the at least one electronic structure and/or structured element described above. Between at least two individual chips of the plurality of chips 220 a trench 230 may be formed by at least one of the above mentioned methods, such as mechanical sawing, laser dicing, plasma dicing, and the like. The trench may be formed such that a predetermined depth 234 may be provided. The bottom 232 of the trench 230 may be formed into the wafer 210. The sidewalls of the trench 216, 226 may be either sidewalls 216 of the wafer 210 or may be sidewalls 226 of at least two chips of the plurality of chips 220. Thus, the sidewalls 216, 226 may extend from the first side 222 of the plurality of chips 220 into the chips of the plurality of chips and the wafer 210 to a predetermined depth 234.

Figure 3:
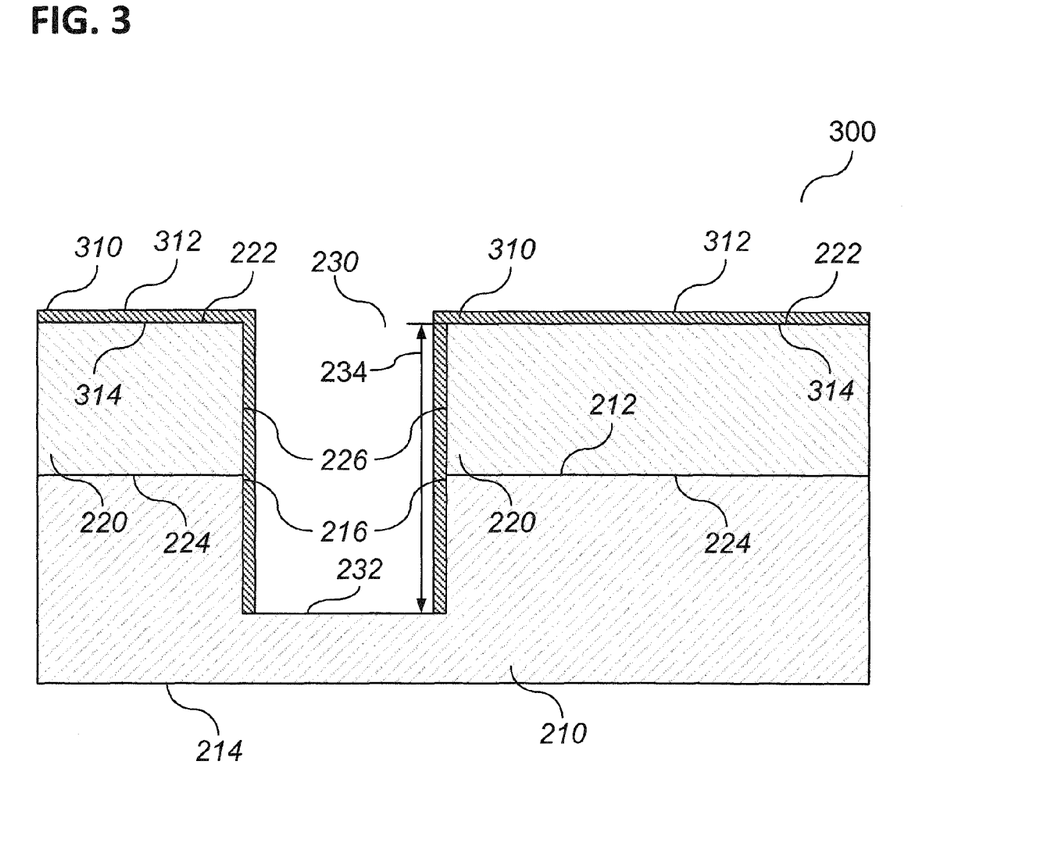
FIG. 3 shows a chip arrangement according to various embodiments.

FIG. 3 shows a chip arrangement 300. The chip arrangement 200 described above may be provided to the chip arrangement 300, wherein a diffusion barrier layer 310 may be formed at least partially over at least the sidewalls 216, 226 of the trench 230 and/or the first side 212 of each chip of the plurality of chips 220. The diffusion barrier layer 310 may be similar to the diffusion barrier layer described above. The diffusion barrier layer 310 may have a first side 312 and a second side 314 opposite the first side 312. The first side 312 may be substantially a bare side. The second side 314 may be formed adjacent to the first sides 222 and the sidewalls 226 of the plurality of chips and the sidewalls 216 of the wafer 210 in the trench 230.

Figure 4:
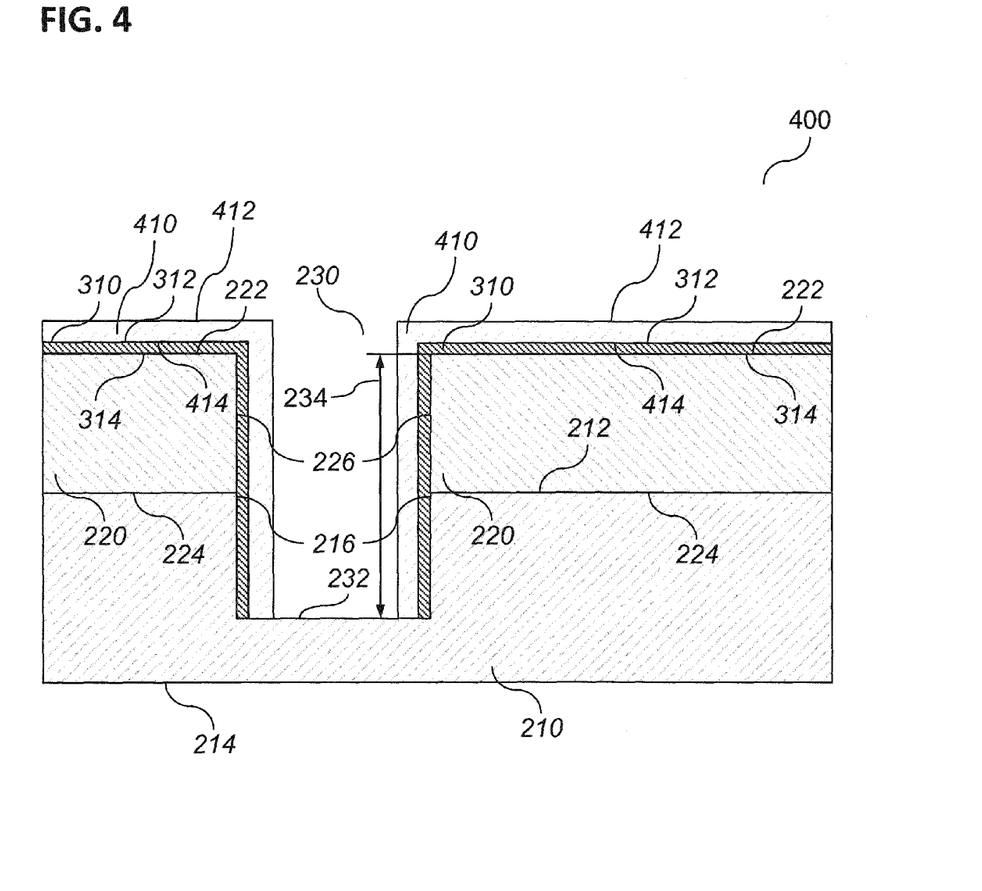
FIG. 4 shows a chip arrangement according to various embodiments.

FIG. 4 shows a chip arrangement 400. The chip arrangement 300 described above may be provided to the chip arrangement 400, wherein a passivation layer 410 may be formed at least partially over the first sides 312 of the diffusion barrier layer 210. The passivation layer 410 may be similar to the passivation layer described above. The passivation layer 410 may have a first side 412 and a second side 414 opposite the first side 412. The first side 412 may be substantially a bare side. The second side 414 may be formed adjacent to the first side 312 of the diffusion barrier layer 310.

Figure 5:
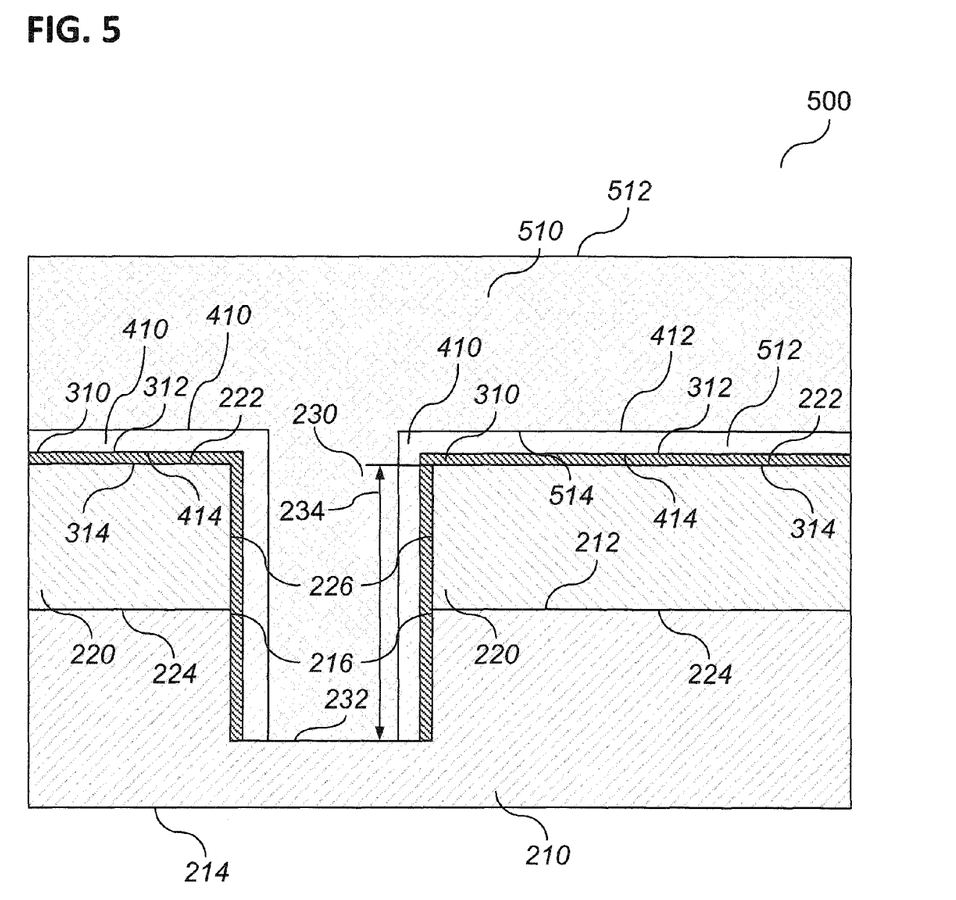
FIG. 5 shows a chip arrangement according to various embodiments.

FIG. 5 shows a chip arrangement 500. The chip arrangement 400 described above may be provided to the chip arrangement 500, wherein a encapsulation material 510 may be formed at least partially over the first sides 412 of the passivation layer 410. The encapsulation material 510 may be similar to the encapsulation material described above. The encapsulation material 510 may have a first side 512 and a second side 514 opposite the first side 512. The first side 512 may be substantially bare. The second side 514 may be formed adjacent to the first side 412 of the passivation layer 310 and the bottom 232 of the trench 230. The encapsulation material 510 may fill at least partially the trench 230.

Figure 6:
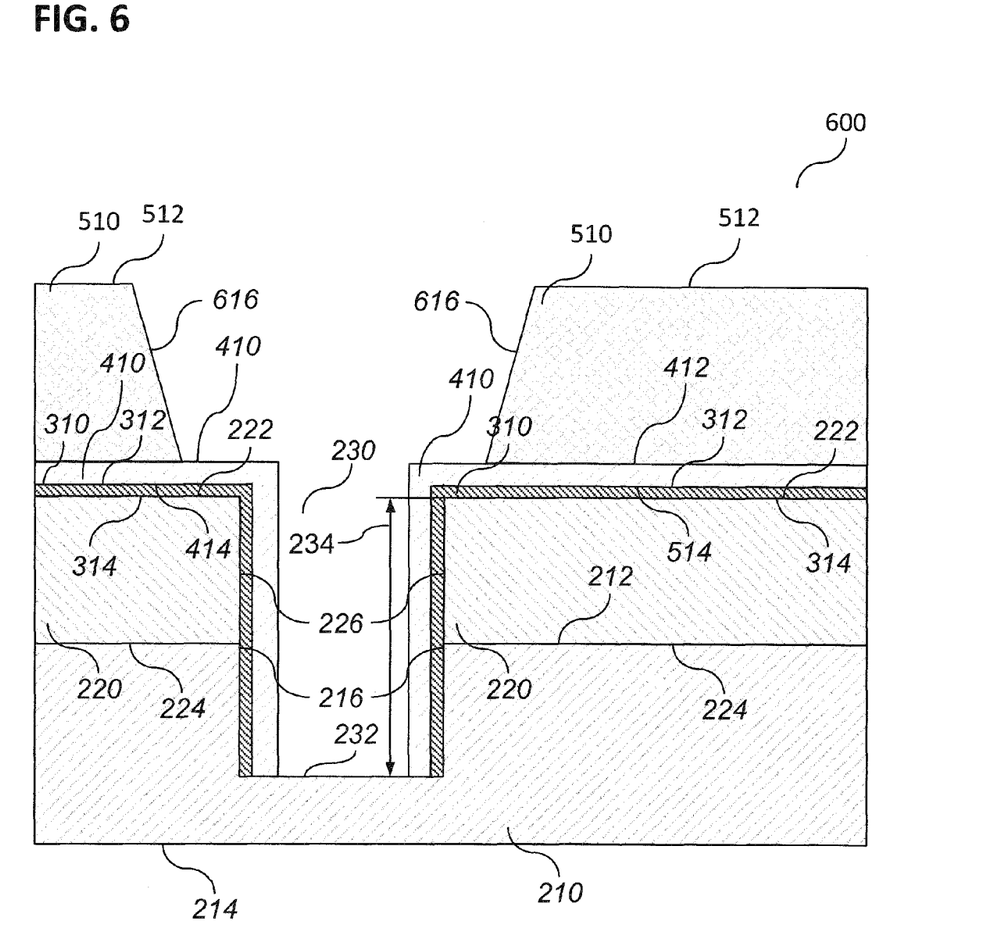
FIG. 6 shows a chip arrangement according to various embodiments.

FIG. 6 shows a chip arrangement 600. The chip arrangement 500 described above may be provided to the chip arrangement 600, wherein the encapsulation material 510 may be removed (e.g. by means of etching and/or plasma etching) so that at least the trench 230 including portions of the diffusion barrier layer 310 and passivation layer 410 which may be disposed at least partially within the trench 230 may be exposed at least partially. As shown in FIG. 6, the passivation layer 410 may further be exposed at least partially from encapsulation material 510 at portions on top of the plurality of chips 220. The partial exposure of at least the trench 230 by means of a removing (or etching and/or plasma etching) process may form e.g. inclined sidewalls 616 of the encapsulation material 510, wherein removing at least partially the encapsulation material 510 may be performed e.g. by means of an anisotropic etching (or anisotropic plasma etching). The anisotropic etching (or anisotropic plasma etching) may remove the encapsulation material 510 at least partially from and above the trench 230.

Figure 7:
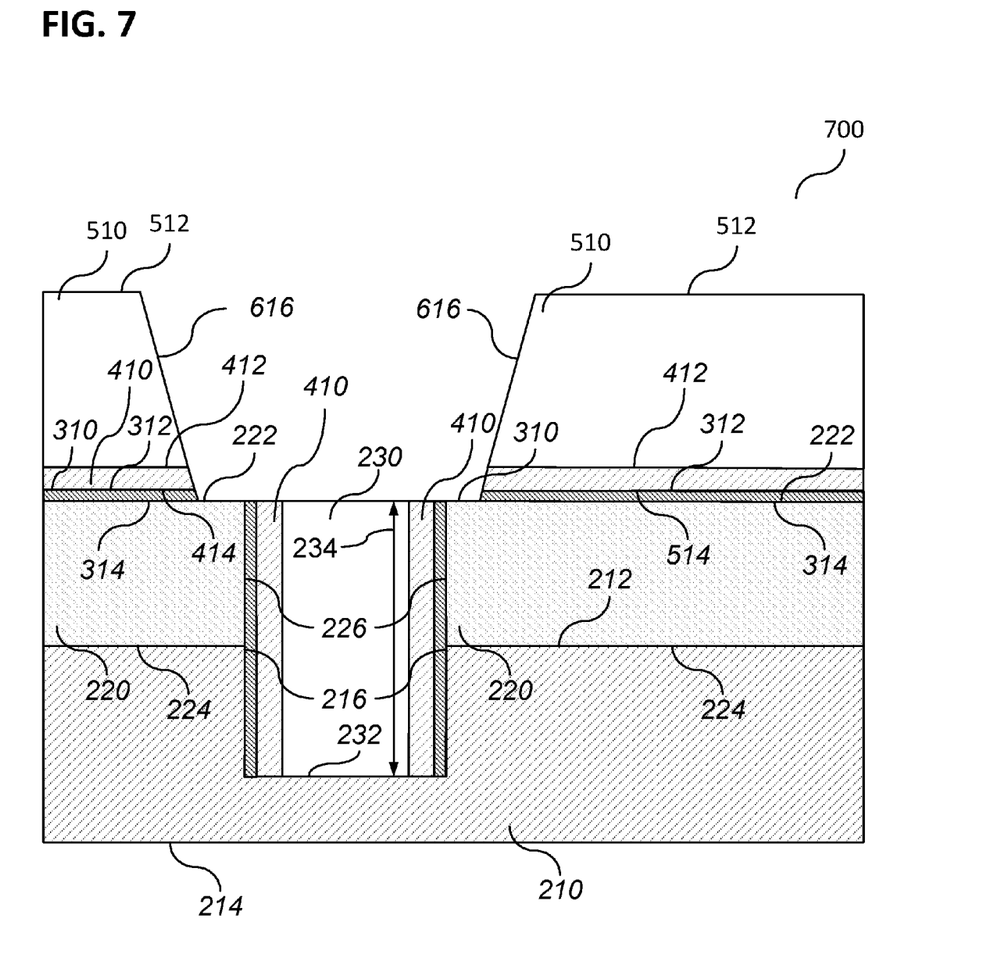
FIG. 7 shows a chip arrangement according to various embodiments.

FIG. 7 shows a chip arrangement 700. The chip arrangement 600 described above may be provided to the chip arrangement 700, wherein by means of a subsequent anisotropic etching process (or anisotropic plasma etching process) portions of the first sides 222 of the plurality of chips 220 may be exposed at least partially. In other words, during the subsequent anisotropic etching process (or anisotropic plasma etching process) at least a portion, where the diffusion barrier layer 310 and the passivation layer 410 may be exposed at least partially on the first sides 222 of the plurality of chips 220, may be removed such that these portions of first sides 222 of the plurality of chips 220 may be substantially free from layer material.

Figure 8:
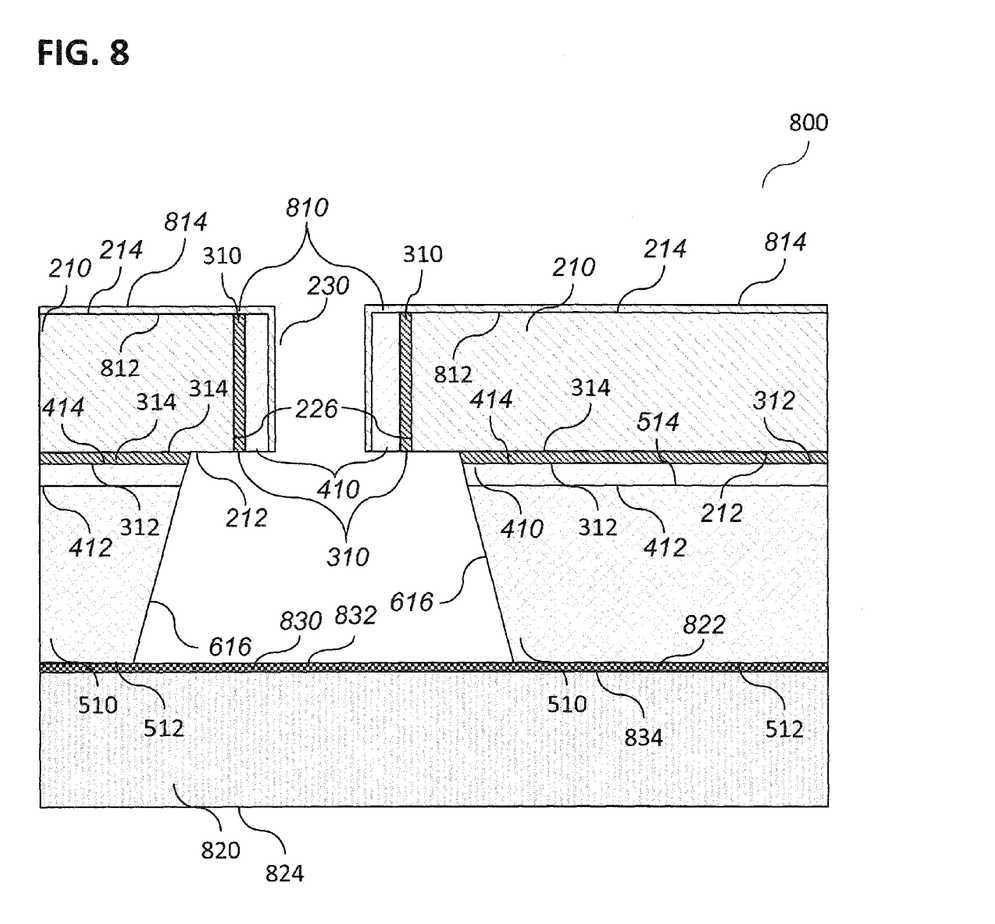
FIG. 8 shows a plurality of chips according to various embodiments.

FIG. 8 shows a chip arrangement 800. The chip arrangement 700 described above may be provided for obtaining the chip arrangement 800 by means of a processing according to method 100, wherein the chip arrangement 700 may be mounted (e.g. bonded) with its first side 512 of the encapsulation material 510 on a foil 830 which may be mounted on a carrier (e.g. a glass carrier) 820. The foil 830 and the carrier 810 may be similar to the foil and carrier described above. The foil may have a first side 832 and a second side 834 opposite the first side 832. The carrier may have a first side 822 and a second side 824 opposite the first side 822. The chip arrangement 700 may be mounted (e.g. bonded) upside down on the foil 830, wherein the first side 512 of the encapsulation material may be adjacent to the first side 832 of the foil 830. The second side 834 of the foil 830 may be adjacent to the first side 822 of the carrier 820. The second side 824 of the carrier 820 may be substantially a bare side.

The chip arrangement 700 may be thinned, e.g. by means of grinding, from its back side which may be the second side 214 of the wafer 210. The chip arrangement 700 may be thinned by means of grinding of the chip arrangement 700 according to method 100 described above. The chip arrangement 700 may be at least thinned up to at least a predetermined thickness 238 of the trench 230 such that the plurality of chips 220 may be separated automatically into a plurality of individualized chips 220.

A metallization structure 810 may be disposed at least partially over at least the second side 214 of the plurality of chips 220. The metallization structure 810 may be similar to the metallization structure described above. Furthermore, the metallization structure 810 may further be disposed at least partially over the sidewalls 226 of the plurality of chips 220 including at least the diffusion barrier layer 310 and/or the passivation layer 410. The metallization structure 810 may have a first side 812 and a second side 814 opposite the first side 812. The first side 812 may be formed at least partially adjacent to at least the second side 214 of the plurality of chips 210, the diffusion barrier layer 310, and/or the passivation layer 410. The second side 814 may be substantially a bare side. The metallization structure 810 formed at least partially over at least the plurality of individualized chips 220 and/or at least the sidewalls 226 including at least the diffusion barrier layer 310 and/or the passivation layer 410 may be formed for diffusion soldering in one or more subsequent Back-End-Of-Line (BEOL) processes.

Figure 9:
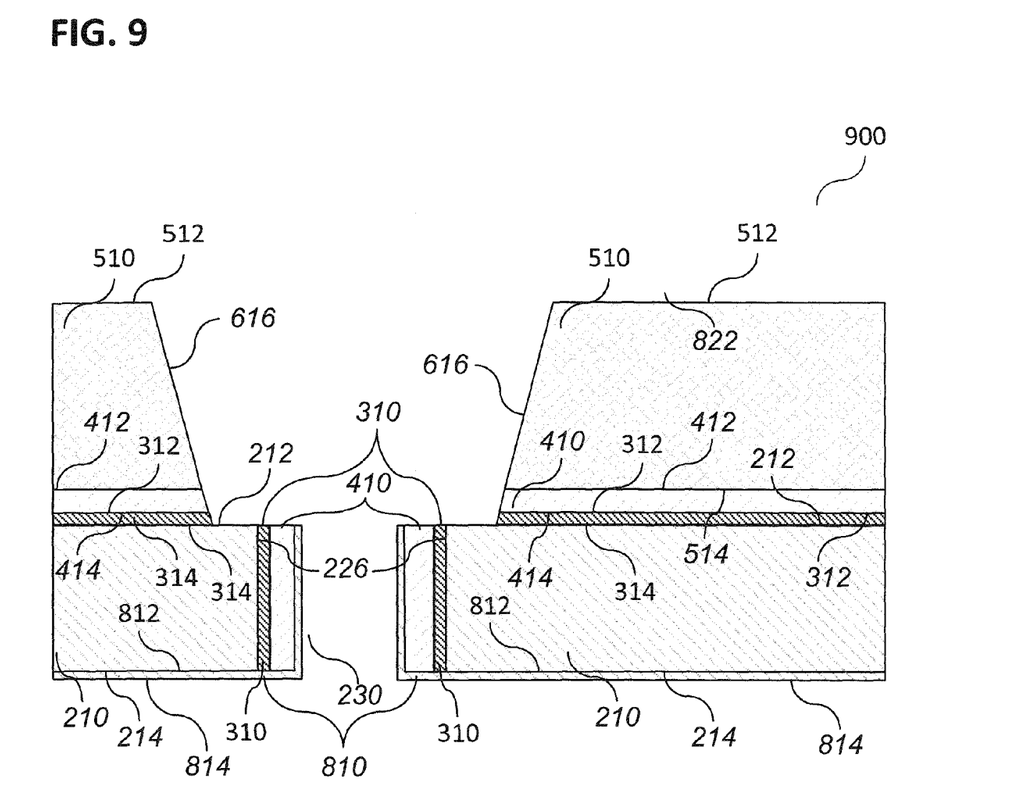
FIG. 9 shows a plurality of chips according to various embodiments.

FIG. 9 shows an arrangement 900 of the plurality of chips 220 after the separation according to method 100. The plurality of chips 220 of the chip arrangement 800 described above may be removed (e.g. demounted or unlaminated) from the foil 830, for example, by means of a conventional pick-and-place process. Each chip of the plurality of chips 220 may include at least a chip 210, a diffusion barrier layer 310 and/or a passivation layer 410, a metallization structure 810, and an encapsulation material 510, wherein these parts may be formed in the same order as described above. Moreover, the at least one diffusion barrier layer 310 and/or the at least one passivation layer 410 and/or at least one buffer layer may be deposited at least partially over at least the first side 212 of the plurality of chips and at least over the sidewalls 226 of the plurality of chips 220 in the trench 230 in any arrangement (i.e. number, material, thicknesses of layers as described above), as well as, any order of these layers may be deposited at least partially over at least a first side 212 of the plurality of chips and at least the sidewalls 226 of the plurality of chips 220 in the trench 230.

In various embodiments, a method for processing a wafer including a plurality of chips may be provided, wherein the method may include: forming a trench in the wafer between the plurality of chips; forming a diffusion bather layer at least over the sidewalls of the trench; forming encapsulation material over the plurality of chips and in the trench; and singularizing the plurality of chips from a side opposite the encapsulation material.

In various embodiments, the method for processing a wafer including a plurality of chips may further include: forming a metallization structure over the side opposite the encapsulation material.

In various embodiments, the method for processing a wafer including a plurality of chips may further include: forming a passivation layer over the plurality of chips; wherein the encapsulation material may be formed over the passivation layer.

In various embodiments, the trench may be formed by means of a process selected from a group which may include or consist of: mechanical sawing, laser dicing, and/or plasma dicing.

In various embodiments, the diffusion bather layer may be formed at least over the sidewalls of the trench, wherein the diffusion bather layer may include a metal diffusion bather layer.

In various embodiments, the diffusion bather layer may have a layer thickness in the range from about 50 nm to about 200 nm, e.g. in the range from about 75 nm to about 150 nm, e.g. of about 100 nm.

In various embodiments, the plurality of chips may be singularized from the side opposite the encapsulation material by means of thinning the wafer.

In various embodiments, thinning the wafer may include grinding the wafer.

In various embodiments, the encapsulation material may be formed over the plurality of chips and in the trench by means of spin on coating.

In various embodiments, the method for processing a wafer including a plurality of chips may further include: removing the encapsulation material at least from a portion of the trench.

In various embodiments, the encapsulation material may be removed by means of lithographic processing.

In various embodiments, the lithographic processing may include etching.

In various embodiments, the etching may include anisotropic etching.

In various embodiments, the wafer may include a silicon wafer.

In various embodiments, the metallization structure may include copper.

In various embodiments, the diffusion bather may include titanium.

In various embodiments, a chip may be provided, wherein the chip may include: a chip substrate; a diffusion bather layer at least partially disposed over at least one sidewall of the chip substrate; encapsulation material disposed over a first main side; and a metallization structure disposed over a second main side, wherein the second main side being opposite the first main side.

In various embodiments, the metallization structure may include copper.

In various embodiments, the chip substrate may include silicon.

In various embodiments, the metallization structure may be further disposed over at least a portion of at least one sidewall of the chip substrate.

In various embodiments, the chip may further include: a passivation layer formed between the chip substrate and the encapsulation material.

In various embodiments, the diffusion bather layer may include a metal diffusion bather layer.

In various embodiments, the diffusion bather layer may include titanium.

In various embodiments, the diffusion bather layer may be formed having a layer thickness in the range from about 50 nm to about 200 nm, e.g. in the range from about 75 nm to about 150 nm, e.g. of about 100 nm.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a wafer comprising a plurality of chips disposed on the wafer; wherein each chip of the plurality of chips comprises an active side and an inactive side opposite the active side; and wherein the inactive side of each chip is disposed on the wafer, the method comprising: forming a trench in the wafer between the plurality of chips; wherein the trench extends into the wafer from the same side as the active side of the chip; forming a diffusion barrier layer at least over sidewalls of the trench; forming encapsulation material over the active side of the plurality of chips and in the trench; wherein the encapsulation material comprises at least one material selected from the group consisting of a polyester resin, a vinyl ester resin, a synthetic resin, a fiberglass, an epoxy, a polymer, a polyimide, a polyamide, a polyamide-imide, a poly(methyl glutarimide), a SU-8 photoresist, a phenol formaldehyde resin, a polymethylmethacrylate, and combinations thereof; and singularizing the plurality of chips from a side opposite the encapsulation material.

2. The method of claim 1, further comprising:
forming a metallization structure over the side opposite the encapsulation material.

3. The method of claim 1, further comprising:
forming a passivation layer over the active side of the plurality of chips;
wherein the encapsulation material is formed over the passivation layer.

4. The method of claim 1,
wherein the trench is formed by means of a process selected from a group consisting of:
mechanical sawing;
laser dicing; and
plasma dicing.

5. The method of claim 1,
wherein the diffusion barrier layer comprises a metal diffusion barrier layer.

6. The method of claim 1,
wherein the diffusion barrier layer has a layer thickness in the range from about 50 nm to about 200 nm.

7. The method of claim 1,
wherein the plurality of chips are singularized from the side opposite the encapsulation material by means of thinning the wafer.

8. The method of claim 7,
wherein thinning the wafer comprises a grinding the wafer.

9. The method of claim 1,
wherein the encapsulation material is formed over the active side of the plurality of chips and in the trench by means of spin on coating.

10. The method of claim 1, further comprising:
removing the encapsulation material at least from a portion of the trench.

11. The method of claim 10,
wherein the encapsulation material is removed by means of lithographic processing.

12. The method of claim 11,
wherein the lithographic processing comprises etching.

13. The method of claim 12,
wherein the etching comprises anisotropic etching.

14. The method of claim 1,
wherein the wafer comprises a silicon wafer.

15. The method of claim 2,
wherein the metallization structure comprises copper.

16. The method of claim 1,
wherein the diffusion barrier comprises titanium.

17. The method of claim 1, wherein at least one sidewall of the trench contacts at least one chip of the plurality of chips.

* * * * *